US007532002B2

(12) United States Patent
Kraemer et al.

(10) Patent No.: US 7,532,002 B2
(45) Date of Patent: May 12, 2009

(54) APPLIANCE TERMINAL

(75) Inventors: Rudolf Kraemer, Lautertal (DE); Werner Tille, Stockstadt (DE); Eric Lude, Berlin (DE); Thomas Schueppler, Berlin (DE); Andreas Jurisch, Schwante (DE)

(73) Assignees: Tyco Electronics AMP GmbH, Bensheim (DE); Siemens Aktiengesellschaft, Munich (DE)

( * ) Notice: Subject to any disclaimer, the term of this patent is extended or adjusted under 35 U.S.C. 154(b) by 250 days.

(21) Appl. No.: 11/568,695

(22) PCT Filed: May 3, 2005

(86) PCT No.: PCT/EP2005/004801

§ 371 (c)(1), (2), (4) Date: Nov. 3, 2006

(87) PCT Pub. No.: WO2005/106505

PCT Pub. Date: Nov. 10, 2005

(65) Prior Publication Data

US 2007/0222432 A1 Sep. 27, 2007

(30) Foreign Application Priority Data

May 4, 2004 (DE) ....................... 10 2004 021 835

(51) Int. Cl.
*G01R 19/14* (2006.01)
*H01H 13/60* (2006.01)

(52) U.S. Cl. ....................................... 324/157; 439/527

(58) Field of Classification Search ................ 324/157; 439/527
See application file for complete search history.

(56) References Cited

U.S. PATENT DOCUMENTS

| | | | | |
|---|---|---|---|---|
| 3,813,579 | A * | 5/1974 | Doyle et al. | 361/46 |
| 6,287,132 | B1 | 9/2001 | Perino et al. | |
| 6,515,468 | B1 | 2/2003 | Morimoto et al. | |
| 6,530,793 | B2 * | 3/2003 | Eichhorn et al. | 439/218 |
| 2001/0021605 | A1 | 9/2001 | Bolam | |
| 2002/0084914 | A1 | 7/2002 | Jackson et al. | |
| 2002/0145416 | A1 | 10/2002 | Attarian et al. | |
| 2004/0043648 | A1 | 3/2004 | Houtz | |

FOREIGN PATENT DOCUMENTS

| | | | |
|---|---|---|---|
| DE | 1018150 | B | 10/1957 |
| DE | 3340253 | A1 | 5/1985 |
| DE | 9406290 | U1 | 6/1994 |
| DE | 4421789 | A1 | 6/1995 |
| DE | 10049751 | A1 * | 4/2002 |

* cited by examiner

*Primary Examiner*—Vincent Q Nguyen
(74) *Attorney, Agent, or Firm*—Barley Snyder LLC

(57) ABSTRACT

An appliance terminal for connecting external lines to an electrical appliance features a current transformer module. The module has a current transformer integrated into the appliance terminal, wherein inputs of the current transformer are connected to customer-side terminal connections of the electrical appliance and outputs of the current transformer may be connected to circuit boards or modules of the electrical appliance via contact elements of the appliance terminal.

10 Claims, 5 Drawing Sheets

APPLIANCE TERMINAL

The invention relates to an appliance terminal for the electrical connection of electrical lines to contacts provided in an electrical device, the appliance terminal comprising terminal elements received in a terminal housing for gripping the electrical lines and contact elements for the electrical connection of the contacts of the electrical device.

Appliance terminals for connecting external electrical lines to electrical appliances, for example electrical field appliances such as protection equipment for energy distribution networks, are generally known. An appliance terminal conventionally comprises a housing with insertion openings for the external lines, terminal elements for gripping the electrical lines being provided in the region of the insertion openings. The terminal elements are conventionally connected to contact elements, which may be connected, for example, to circuits of the electrical device. Appliance terminals of this type are often also installed in a wall of the electrical device and are used, as it were, to guide the current path from the external lines into the interior of the electrical device.

Electrical appliances that are used in the field of power automation often comprise, in their interior, current transformers, which are used for connecting to a power distribution network in order to evaluate current-related characteristics with the electrical device. The current transformers are usually magnetic measuring transformers.

The object of the invention is to develop an appliance terminal for electrical appliances comprising current transformers.

This object is achieved by an appliance terminal of the type specified above, in which, according to the invention, a current transformer is integrated into the terminal housing and wherein inputs of the current transformer are connected to the terminal elements of the appliance terminal and outputs of the current transformer are connected to the contact elements of the appliance terminal. Since the current transformer is integrated into the appliance terminal, the drawbacks of mounting a current transformer directly on a module are prevented: mounting a current transformer on a printed circuit board places a heavy mechanical load on the printed circuit board, and this may cause deflection of the printed circuit board, particularly when the electrical device vibrates, as a result of which special metal sheet supports are required. Moreover, the EMC properties of transformers within the housing of sensitive electrical appliances, such as protection equipment, are important. In the appliance terminal according to the invention, the mounting face on the modules, which was previously required for the current transformer, may be dispensed with, so the size of the device housings may optionally be reduced or other components may be received on the mounting face. The modules may also be designed purely for equipping machines, as a result of which productivity increases. As the current transformer is no longer arranged within the housing in proximity to the electronics of the electrical device, disadvantageous EMC influences are avoided. For the customer, the appliance terminal, together with the current transformer including the connected wiring, may also be removed, thus simplifying maintenance.

An embodiment of the invention is illustrated in the drawings and will be explained in greater detail in the following description. In the drawings.

Figure 1:
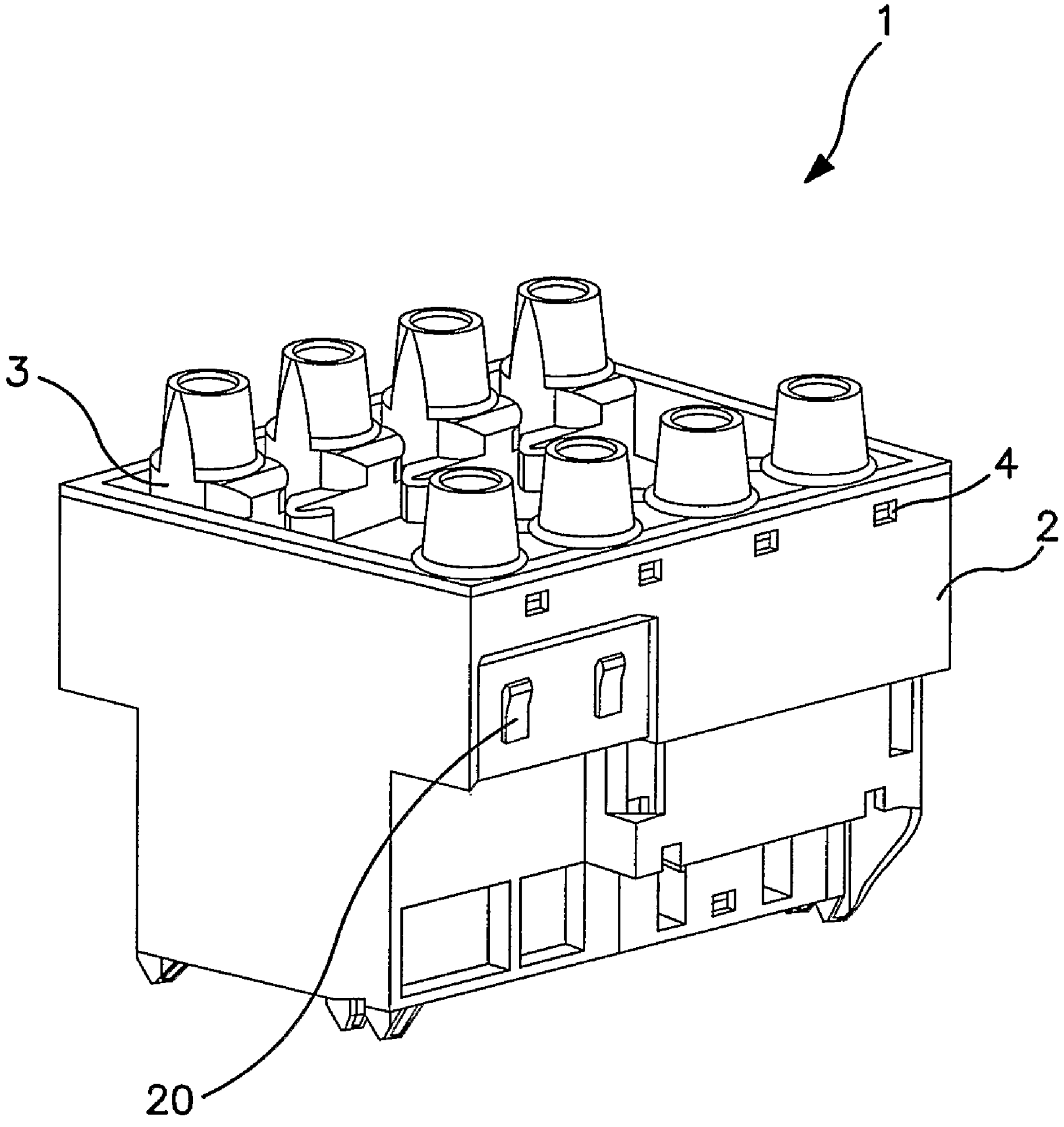
FIG. 1 is a perspective view of an appliance terminal, into which a current transformer is integrated according to an exemplary embodiment of the present invention.
Figure 2:
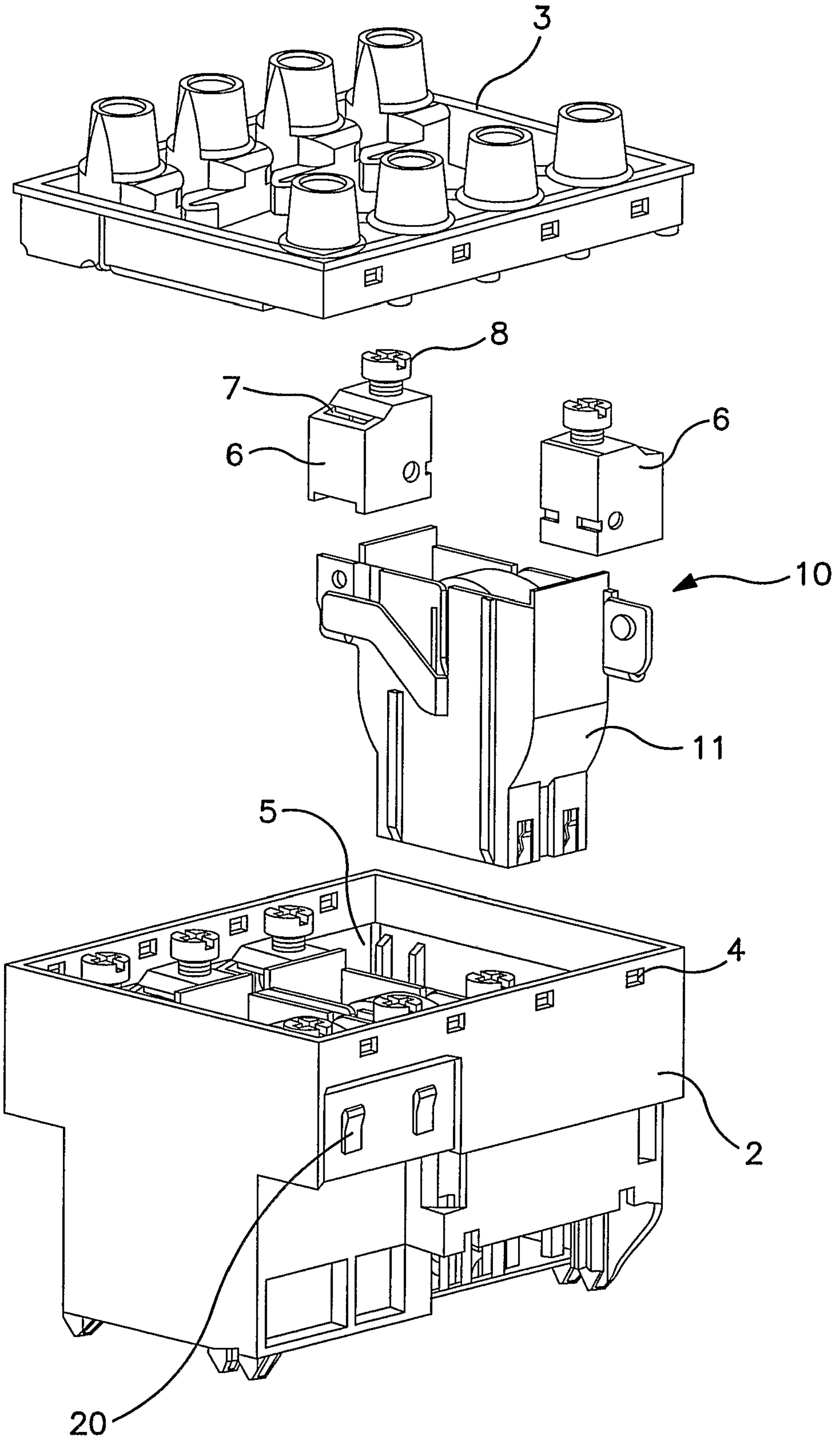
FIG. 2 is an exploded perspective view of the appliance terminal of FIG. 1.

The appliance terminal 1 illustrated in FIGS. 1 and 2 comprises a terminal housing, which comprises a housing shell 2 and a covering plate 3. The housing shell 2 and covering plate 3 may be locked together via locking elements 4, such as projections and recesses, and may thus be attached via the interlocking connection.

The housing shell 2 is divided into chambers 5 that are separated by partitions and into which current transformer modules 10 may be inserted and fixed with an interlocking fit. FIG. 2 shows three current transformer modules that have already been integrated into the housing shell 2 and a current transformer module 10 illustrated outside the housing shell 2, part of which is shown in an exploded view. The current transformer modules 10 comprise terminal attachments 6, into which terminal elements, for example in the form of terminal blocks, gripping frames or other gripping members, are embedded for the electrical connection of external lines. These terminal elements may be constructed such that lines to be connected are inserted through openings in the covering plate 3 into insertion openings 7 in the terminal attachments 6, and are attached on or in the embedded terminal element via a terminal screw 8, and are thereby connected in an electrically conductive manner.

Figure 3B:
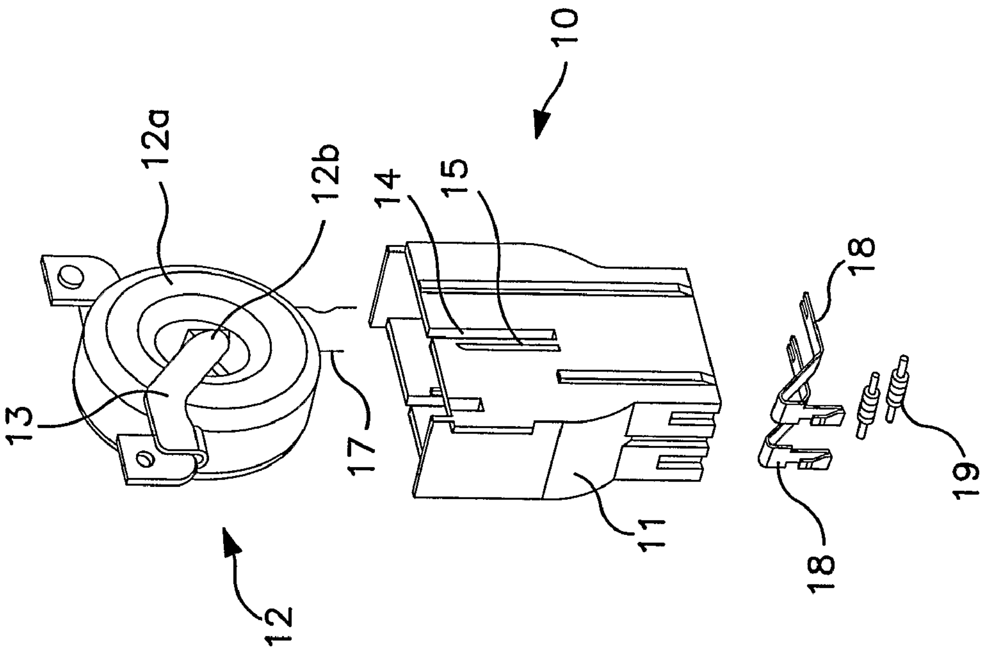
FIG. 3B is a perspective, exploded view of the current transformer of FIG. 3A.
Figure 3A:
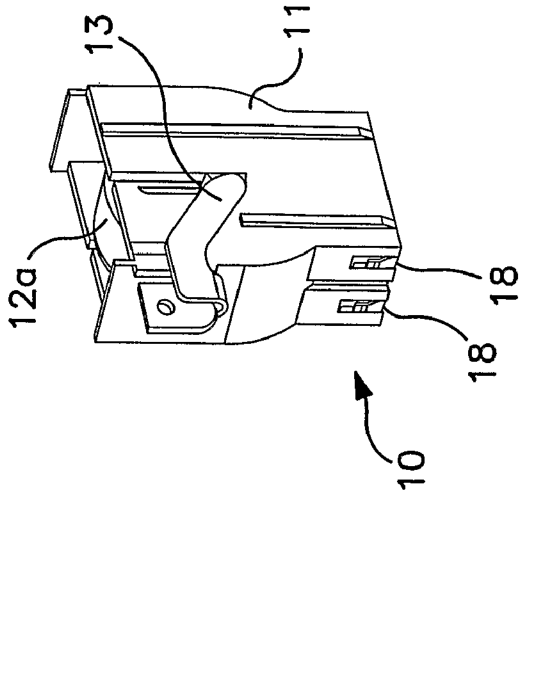
FIG. 3A is a perspective view of a current transformer that may be integrated into the appliance terminal of FIGS. 1 and 2.

FIG. 3A is a plan view and FIG. 3B a more detailed exploded plan view of an individual current transformer module 10, which, according to FIG. 2, may be inserted into a chamber 5 of the housing shell 2.

The current transformer module 10 comprises a current transformer 12 received in a transformer housing 11, the current transformer 12 being configured as an annular core current transformer in which a secondary winding 12*a* is wound around an annular core, through the opening in which core a primary winding 12*b* of the current transformer 12 is guided. In the illustrated current transformer module 10, the transformer housing 11 is at least partially adapted to the annular core, which is received on end in the transformer housing 11. In an advantageous embodiment, the annular core of the current transformer consists substantially of an iron/cobalt alloy. The active ingredient Vitrovac, which is sold by the company Vacuumschmelze GmbH & Co. KG and exhibits high magnetic permeability, is preferred in a practical context.

The primary winding 12*b* is configured as a sheet metal band or strip with ends 13, which serve as the input to the current transformer 12. Slots 14, through which ends 13 of the sheet metal strip of the primary winding 12*b* are outwardly guided, are formed in the centre of the transformer housing 11. The ends 13 are fixed in the slots 14 by means of respective projections 15 moulded onto the transformer housing 11. The primary winding 12*b* is thus centred with respect to the annular core and the secondary winding 12*a*. The slot 14 is also open toward the upper side of the transformer housing 11 and allows the sheet metal strip to be introduced during the mounting of the transformer module 10.

As may be seen in FIG. 3B, the secondary winding 12*a* of the current transformer 12 comprises electrical connection cables 17, which serves as the output of the transformer 12. The connection cables 17 are guided through the transformer housing 11 during the mounting of the transformer module 10 and are connected to contact elements 18 in the form of spring contacts. As may be seen in FIG. 3A, after mounting, the contact elements 18 are locked to the lower side of the transformer housing 11. The contact elements 18 may, for example, pertain to a direct plug connector in the form of a contact strip, into which a printed circuit board may be inserted. In this case, an electrical connection is produced via the contact elements 18 between the secondary winding 12$a$ of the current transformer 12 and contacts, for example in the form of strip conductors, extending on the printed circuit board.

Load resistors 19 may be provided for preventing sparkovers occurring on the secondary side of the transformer 12. If required, such resistors are connected to the respective contact element 18 transversely to the contact elements 18, which are arranged in parallel, and are located in the lower region of the transformer housing 11.

As may be seen from FIG. 2, once it has been assembled, the transformer module 10 is plugged into the housing shell 2 of the terminal housing and is fixed in the housing shell 2 by means of the locking elements 4, by locking the covering plate 3.

Figure 4:
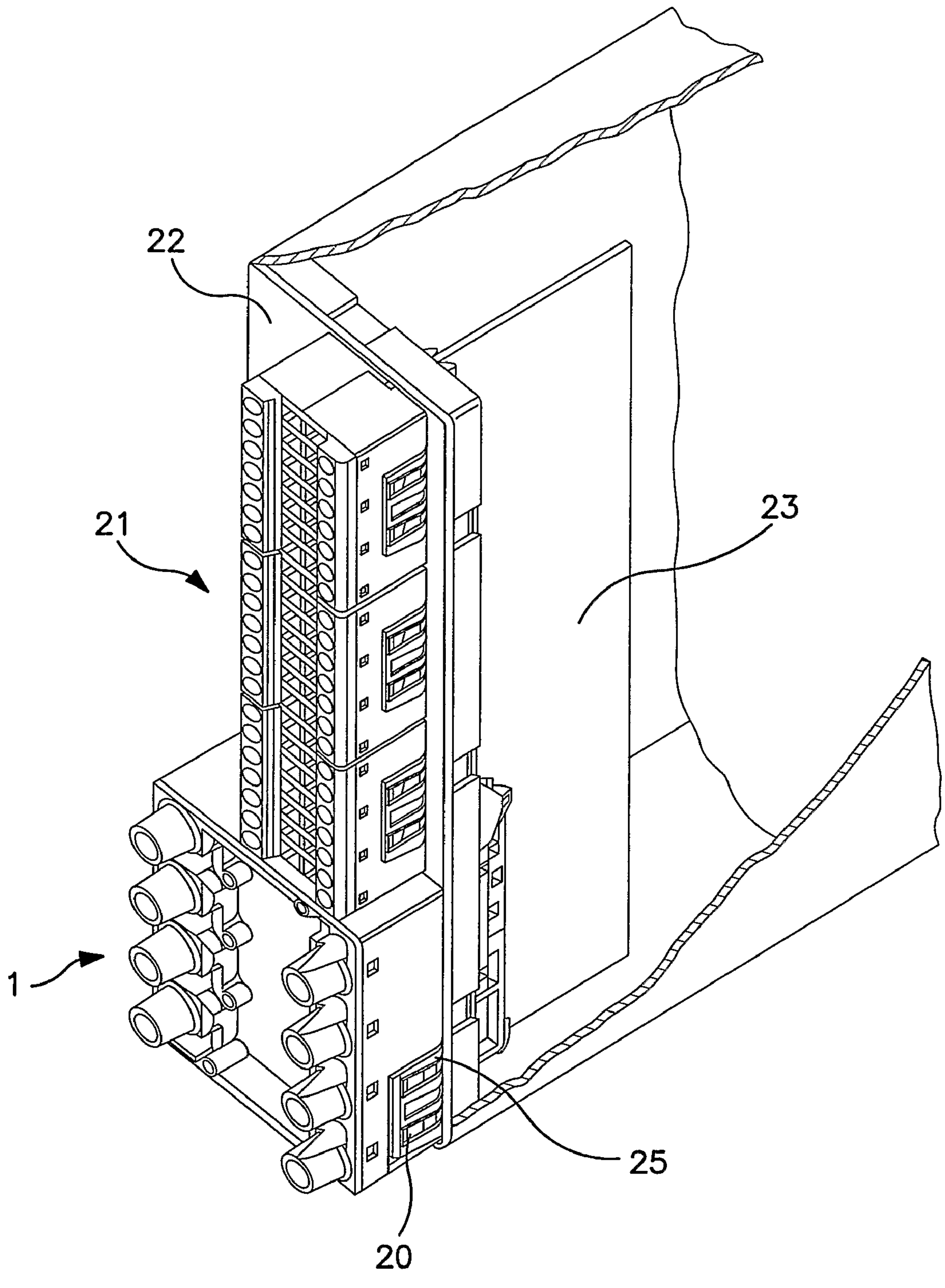
FIG. 4 is a perspective view of the appliance terminal of FIGS. 1 and 2 mounted on the back wall of an appliance.

In FIG. 4, the appliance terminal 1, together with other plug connector elements 21, is mounted in a back wall 22 of an electrical device. For the sake of clarity, some of the side walls of the electrical device are illustrated in a broken away view.

Figure 5:
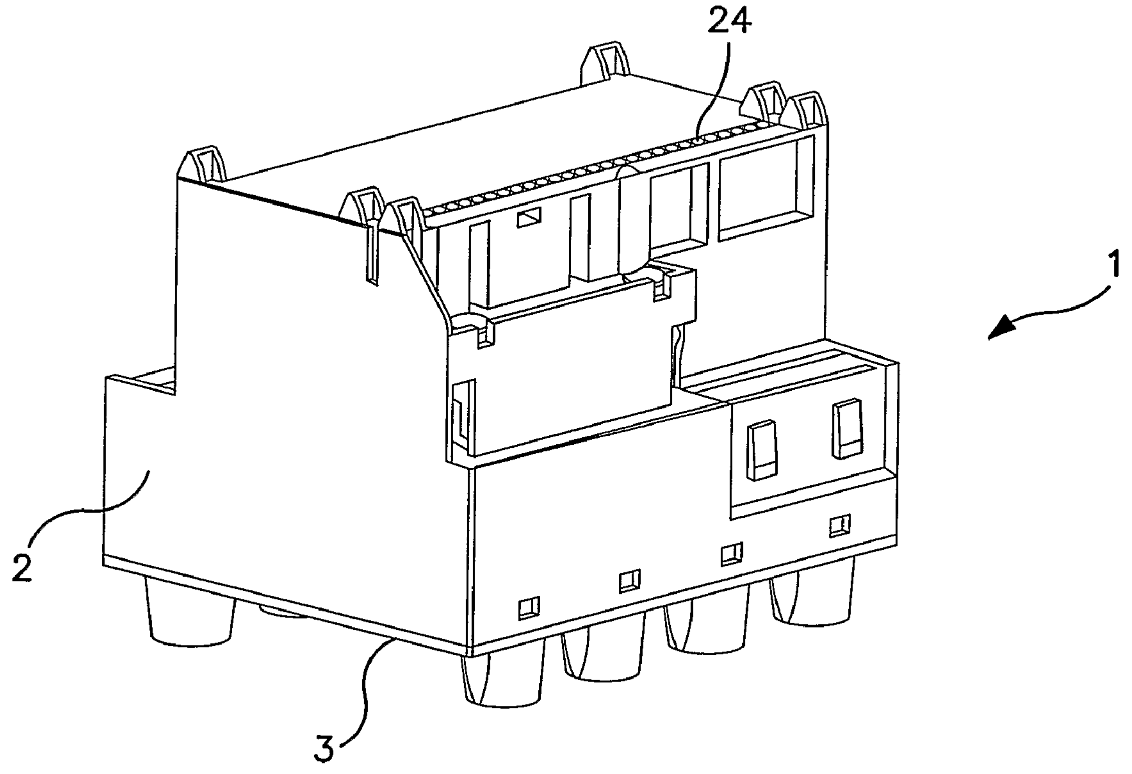
FIG. 5 is a perspective view of the appliance terminal of FIGS. 1 and 2 from below.

The appliance terminal 1 extends partially through the back wall 22 and thus provides a possible connection for a module 23, in the form of a printed circuit board (indicated only schematically), arranged in the device. According to FIG. 4, an end face of the printed circuit board is inserted into a recess 24, which may be recognised more clearly in FIG. 5, on the lower side of the housing shell 2. The contact elements 18 (shown in FIGS. 3A and 3B) are arranged within the recess 24 and thus form with the recess 24 a plug connector on the housing shell 2 for receiving the printed circuit board 23.

The appliance terminal 1 may be locked in spring locking elements 25, attached to the back wall 22 of the electrical device, and thus be detachably fastened, by means of locking noses 20 attached laterally to the housing shell 2.

The current transformer 12 integrated into the appliance terminal 6 may be what is known as an unconventional transformer, i.e. an electronic transformer such as, for example, a Hall sensor or an optoelectronic transformer, or a conventional current transformer in the form of an electromagnetic current transformer having a primary winding and a secondary winding. In the latter case, the primary winding 12$b$ of an electromagnetic current transformer is connected to the terminal elements of the appliance terminal 6, and the secondary winding 12$a$ of the electromagnetic current transformer to the contact elements 18 of the appliance terminal. Electromagnetic current transformers are widely available and possess a substantially linear transfer characteristic.

The invention claimed is:

1. An appliance terminal for electrically connecting an electrical line to a contact of an electrical appliance, the appliance terminal comprising:
- a terminal housing;
- an electromagnetic current transformer configured to be received within the terminal housing; and having a primary winding connected to a terminal attachment, and a secondary winding connected to a contact element;
- a terminal attachment adapted to grip the electrical line and configured to serve as an electrical input of the current transformer;
- the connection cable configured to serve as an electrical output of the current transformer; and
- the contact element configured to electrically connect the connection cable to the contact of the electrical appliance.

2. The appliance terminal according to claim 1, further comprising:
- a current transformer module having a transformer housing configured to house the current transformer;
- wherein the terminal housing is configured to receive the transformer housing with an interlocking fit.

3. The appliance terminal according to claim 1, the terminal housing comprising:
- locking or snap elements for detachably fastening the terminal housing to the electrical appliance.

4. The appliance terminal according to claim 1, the terminal housing comprising: a housing shell; and
- a covering plate being lockable to the housing shell.

5. The appliance terminal according to claim 1, wherein the contact element is a spring contact adapted for direct electrical connection to the contact of the electrical appliance.

6. The appliance terminal according to claim 5, wherein the spring contact is a component of a plug connector for receiving an end face of a printed circuit board inserted into the electrical appliance.

7. The appliance terminal according to claim 1, wherein the current transformer is configured as an annular core current transformer.

8. The appliance terminal according to claim 7, wherein the annular core of the current transformer consists substantially of an iron/cobalt alloy.

9. The appliance terminal according to claim 1 further comprising:
- a transformer housing configured to house the current transformer, the transformer housing having a slot;
- wherein the terminal housing is configured to receive the transformer housing; and
- wherein the primary winding is configured as a sheet metal strip having two ends and the ends of the primary winding are configured to be guided through the slot in the transformer housing for centering the primary winding.

10. The appliance terminal according to claim 1, further comprising:
- a transformer housing configured to house the current transformer and configured to be received by the terminal housing;
- two terminals electrically connected to the secondary winding; and
- a load resistor electrically connected between the two terminals and the load resister being received within the transformer housing.

* * * * *